United States Patent
Tsai et al.

(10) Patent No.: US 7,060,606 B2
(45) Date of Patent: Jun. 13, 2006

(54) METHOD AND APPARATUS FOR CHEMICAL MECHANICAL POLISHING OF SEMICONDUCTOR SUBSTRATES

(75) Inventors: Stan D. Tsai, Fremont, CA (US); Liang-Yuh Chen, Foster City, CA (US); Lizhong Sun, San Jose, CA (US); Shijian Li, San Jose, CA (US); Feng Q. Liu, Cupertino, CA (US); Rashid Mavliev, Campbell, CA (US); Ratson Morad, Palo Alto, CA (US); Daniel A. Carl, Pleasanton, CA (US)

(73) Assignee: Applied Materials Inc., Santa Clara, CA (US)

( * ) Notice: Subject to any disclaimer, the term of this patent is extended or adjusted under 35 U.S.C. 154(b) by 58 days.

(21) Appl. No.: 10/972,191

(22) Filed: Oct. 22, 2004

(65) Prior Publication Data

US 2005/0282380 A1    Dec. 22, 2005

Related U.S. Application Data

(63) Continuation of application No. 10/199,444, filed on Jul. 19, 2002, now Pat. No. 6,821,881.

(60) Provisional application No. 60/308,030, filed on Jul. 25, 2001.

(51) Int. Cl.
*H01L 21/4763* (2006.01)

(52) U.S. Cl. .................. 438/626; 438/631; 438/633; 438/645; 438/692

(58) Field of Classification Search ............... 438/633, 438/645, 692, 691, 626, 631, FOR. 111
See application file for complete search history.

(56) References Cited

U.S. PATENT DOCUMENTS

| 4,920,031 A | 4/1990 | Ohno et al. |
| 5,340,370 A | 8/1994 | Cadien et al. |
| 5,676,587 A | 10/1997 | Landers et al. |

(Continued)

FOREIGN PATENT DOCUMENTS

EP    1 006 166    6/2000

(Continued)

OTHER PUBLICATIONS

PCT Written Opinion dated Feb. 24, 2005 for PCT/US02/22126. (AMAT/5845PC).

(Continued)

*Primary Examiner*—Michelle Estrada
(74) *Attorney, Agent, or Firm*—Patterson & Sheridan

(57) ABSTRACT

Methods and apparatus for processing substrates to improve polishing uniformity, improve planarization, remove residual material and minimize defect formation are provided. In one aspect, a method is provided for processing a substrate having a conductive material and a low dielectric constant material disposed thereon including polishing a substrate at a polishing pressures of about 2 psi or less and at platen rotational speeds of about 200 cps or greater. The polishing process may use an abrasive-containing polishing composition having up to about 1 wt. % of abrasives. The polishing process may be integrated into a multi-step polishing process.

22 Claims, 3 Drawing Sheets

U.S. PATENT DOCUMENTS

| | | |
|---|---|---|
| 5,693,563 A | 12/1997 | Teong |
| 5,735,963 A | 4/1998 | Obeng |
| 5,783,489 A | 7/1998 | Kaufman et al. |
| 5,842,910 A | 12/1998 | Krywanczyk et al. |
| 5,893,796 A | 4/1999 | Birang et al. |
| 5,897,426 A | 4/1999 | Somekh |
| 5,954,997 A | 9/1999 | Kaufman et al. |
| 5,981,454 A | 11/1999 | Small |
| 5,985,748 A | 11/1999 | Watts et al. |
| 6,001,730 A | 12/1999 | Farkas et al. |
| 6,068,879 A | 5/2000 | Pasch |
| 6,074,949 A | 6/2000 | Schonauer et al. |
| 6,083,840 A | 7/2000 | Mravic et al. |
| 6,113,465 A | 9/2000 | Kim et al. |
| 6,117,775 A | 9/2000 | Kondo et al. |
| 6,117,783 A | 9/2000 | Small et al. |
| 6,136,714 A | 10/2000 | Schutz |
| 6,143,656 A | 11/2000 | Yang et al. |
| 6,156,661 A | 12/2000 | Small |
| 6,165,052 A | 12/2000 | Yu et al. |
| 6,183,686 B1 | 2/2001 | Bardus et al. |
| 6,184,141 B1 | 2/2001 | Avanzino et al. |
| 6,217,416 B1 | 4/2001 | Kaufman et al. |
| 6,218,290 B1 | 4/2001 | Schonauer et al. |
| 6,235,633 B1 | 5/2001 | Jang |
| 6,258,721 B1 | 7/2001 | Li et al. |
| 6,271,416 B1 | 8/2001 | Takagaki et al. |
| 6,375,559 B1 | 4/2002 | James et al. |
| 6,432,823 B1 * | 8/2002 | Huynh et al. ............... 438/690 |
| 6,435,945 B1 | 8/2002 | Somekh |
| 6,444,569 B1 * | 9/2002 | Farkas et al. ............... 438/633 |
| 6,447,371 B1 | 9/2002 | Kaufman et al. |
| 6,475,069 B1 | 11/2002 | Thomas et al. |
| 2001/0013506 A1 | 8/2001 | Chamberlin et al. |
| 2002/0090820 A1 | 7/2002 | Sun et al. |
| 2003/0013387 A1 | 1/2003 | Tsai |
| 2003/0022501 A1 | 1/2003 | Tsai |
| 2003/0022801 A1 | 1/2003 | Sun et al. |
| 2003/0029841 A1 | 2/2003 | Moon |
| 2003/0036339 A1 | 2/2003 | Bonner |
| 2003/0120927 A1 | 6/2003 | Kim |

FOREIGN PATENT DOCUMENTS

| | | |
|---|---|---|
| EP | 1 011 131 | 6/2000 |
| EP | 0 085 067 | 3/2001 |
| EP | 1 093 161 | 4/2001 |
| EP | 1 104 020 | 5/2001 |
| EP | 1 116 762 | 7/2001 |
| EP | 1 125 999 | 8/2001 |
| JP | 2001-127018 | 5/2001 |
| JP | 2001-139937 | 5/2001 |
| KR | 2000 0117109 | 2/2000 |
| WO | WO 98/04646 | 2/1998 |
| WO | WO 98/36045 | 8/1998 |
| WO | WO 98/41671 | 9/1998 |
| WO | WO 98/44061 | 10/1998 |
| WO | WO 98/49723 | 11/1998 |
| WO | WO 99/46081 | 9/1999 |
| WO | WO 00/00561 | 1/2000 |
| WO | WO 00/02235 | 1/2000 |
| WO | WO 00/02238 | 1/2000 |
| WO | WO 00/02255 | 1/2000 |
| WO | WO 00/24842 | 5/2000 |
| WO | WO 00/30156 | 5/2000 |
| WO | WO 00/30159 | 5/2000 |
| WO | WO 00/35627 | 6/2000 |

OTHER PUBLICATIONS

PCT International Search Report dated Mar. 5, 2003 for PCT/US02/22126. (AMAT/5845PC).

PCT Partial Search Report dated Dec. 16, 2002 for PCT/US02/22126. (AMAT/5845PC).

* cited by examiner

METHOD AND APPARATUS FOR CHEMICAL MECHANICAL POLISHING OF SEMICONDUCTOR SUBSTRATES

CROSS-REFERENCE TO RELATED APPLICATIONS

This application is a continuation of U.S. patent application Ser. No. 10/199,444, filed Jul. 19, 2002, now U.S. Pat. No. 6,821,881, which claims benefit of U.S. provisional patent application Ser. No. 60/308,030, filed Jul. 25, 2001. Each of the aforementioned related patent applications is herein incorporated by reference.

BACKGROUND OF THE INVENTION

1. Field of the Invention

Aspects of the invention generally relate to the fabrication of semiconductor devices and to chemical mechanical polishing and planarization of semiconductor devices.

2. Description of the Related Art

Reliably producing sub-half micron and smaller features is one of the key technologies for the next generation of very large-scale integration (VLSI) and ultra large-scale integration (ULSI) of semiconductor devices. However, as the fringes of circuit technology are pressed, the shrinking dimensions of interconnects in VLSI and ULSI technology has placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

In order to further improve the current density of semiconductor devices on integrated circuits, it has become necessary to use conductive materials having low resistivity and materials having low dielectric constants (low k, defined herein as having dielectric constants, k, less than about 4.0) as insulating layers to reduce the capacitive coupling between adjacent interconnects. Increased capacitive coupling between layers can detrimentally affect the functioning of semiconductor devices.

Copper and its alloys have become the materials of choice for sub-quarter-micron interconnect technology because copper has a lower resistivity than aluminum, (1.7 $\mu\Omega$-cm compared to 3.1 $\mu\Omega$-cm for aluminum), a higher current and a higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper-containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e., vias, and horizontal interconnects, i.e., lines. Conductive materials, such as copper-containing materials, and other materials, such as barrier layer materials used to prevent diffusion of copper-containing materials into the surrounding low k dielectric, are then inlaid into the etched pattern. Any excess copper-containing materials and excess barrier layer material external to the etched pattern such as on the field of the substrate is then removed.

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in dual damascene processes to remove excess deposited material and to provide an even surface for subsequent levels of metallization and processing. Planarization may also be used in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing media in a CMP apparatus. The carrier assembly provides a controllable pressure to the substrate urging the substrate against the polishing media. The media is moved relative to the substrate by an external driving force. Thus, the CMP apparatus effects polishing or rubbing movement between the surface of the substrate and the polishing media while dispersing a polishing composition to effect both mechanical activity and chemical activity.

Conventionally, in polishing copper features, such as dual damascene features, the copper-containing material is polished to the level of the barrier layer, and then the barrier layer is polished to a level of the underlying dielectric layer using abrasive polishing solutions. However, such polishing processes often result in uneven removal of materials, such as copper in features and the underlying dielectric layer between features, resulting in the formation of topographical defects, such as concavities or depressions in the features, referred to as dishing, and excess removal of dielectric material surrounding features, referred to as erosion.

FIG. 1 is a schematic view of a substrate illustrating the phenomenon of dishing. Conductive lines 11 and 12 are formed by depositing conductive materials, such as copper or copper alloy, in a feature definition formed in the dielectric layer 10, typically comprised of silicon oxides or other dielectric materials. After planarization, a portion of the conductive material in conductive line 12 is depressed by an amount D, referred to as the amount of dishing, forming a concave copper surface. Additionally, dielectric material found around areas having high feature densities, represented by feature 11, may be excessively eroded compared to dielectric materials on the field of the substrate from the polishing process. Dishing and erosion result in a non-planar surface that impairs the ability to print high-resolution lines during subsequent photolithographic steps and detrimentally affects subsequent surface topography of the substrate and device formation. Dishing and erosion also detrimentally affect the performance of devices by lowering the conductance and increasing the resistance of the devices, contrary to the benefit of using higher conductive materials, such as copper.

An additional difficulty also arises when using low k dielectric material in copper dual damascene formation. Low k dielectric materials are typically soft, porous, and brittle. Current polishing pressures, about 4 psi or greater, can damage the low k dielectric material materials and form defects in the substrate surface such as film delamination.

One solution to reduce dishing and polish low k dielectric material with reduced defect formation is to polish substrates at reduced polishing pressures. However, polishing substrates at reduced pressures often results in less than desirable polishing rates, non-uniform polishing, and less than desirable planarization of the substrate surface. Such process difficulties result in reduced substrate throughput and less than desirable polish quality of the substrate surface. Additionally, low polishing pressure processes may be unable to sufficiently remove all of the desired copper materials from a substrate surface such as at the interface between copper and the barrier layer, which is generally non-planar. Such copper materials retained on the substrate surface, or residues, can detrimentally affect device formation, such as creating short-circuits within or between devices, reduce device yields, reduce substrate throughput, and detrimentally affect the polish quality of the substrate surface.

Therefore, there exists a need for a method and apparatus that facilitates the removal of copper-containing material from the surface of a substrate with minimal or reduced dishing and with essentially no residues remaining after polishing.

SUMMARY OF THE INVENTION

Aspects of the invention generally provide methods for processing substrates to improve polishing uniformity, improve planarization, remove residual material and minimize defect formation. In one aspect, a method is provided for processing a substrate having a conductive material and a low dielectric constant material disposed thereon including polishing a substrate at a polishing pressure of about 2 psi or less and a platen rotational speed of about 200 cps or greater.

In another aspect, a method is provided for processing a substrate including polishing a substrate having a low k dielectric material disposed thereon at a first polishing pressure of about 2 psi or less and a platen rotational speed of about 200 cps or greater, and then polishing the substrate at a second polishing pressure of about 1.5 psi or less.

In another aspect, a method is provided for processing a substrate having a conductive material disposed thereon in a polishing apparatus including polishing the substrate at a first polishing pressure and a first platen rotational speed and polishing the substrate at a second polishing pressure of about 2 psi or less and a second platen rotational speed of about 200 cps or greater.

In another aspect, a method is provided for processing a substrate comprising feature definitions formed in a dielectric layer, a barrier material deposited on the dielectric layer and in the feature definitions, and a conductive material deposited on the barrier material and filling the feature definitions to a polishing apparatus having one or more platens and one or more carrier heads including polishing the substrate at a polishing pressure of greater than 2 psi and a platen rotational speed between about 26 cps and about 130 cps on a first platen, polishing the substrate at a polishing pressure of 2 psi or less and a platen rotational speed of about 200 cps or greater on the first platen, polishing the substrate at a polishing pressure of 2 psi or less and a platen rotational speed of about 200 cps or greater on a second platen, and polishing the substrate at a polishing pressure of greater than 2 psi and a platen rotational speed between about 26 cps and about 130 cps on the second platen.

In another aspect, a method is provided for processing a substrate having a conductive material disposed thereon in a polishing apparatus including polishing the substrate at a first platen rotational speed at a first polishing pressure of about 2 psi or less and polishing the substrate at a second platen rotational speed less than the first platen rotational speed and at a second polishing pressure of about 2 psi or less.

BRIEF DESCRIPTION OF THE DRAWINGS

So that the manner in which the above aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In general, aspects of the invention provide methods and apparatus for polishing substrates with improved polishing uniformity, improved planarization, enhanced residual material removal and reduced or minimal defect formation. The invention will be described below in reference to a planarizing process for the removal of conductive materials, such as copper-containing materials from a substrate surface by chemical mechanical polishing (CMP) techniques with polishing media. Chemical mechanical polishing is broadly defined herein as polishing a substrate by a combination of both chemical and mechanical activity.

The planarization process that can be carried out using chemical mechanical polishing process equipment, such as the Mirra® CMP System available from Applied Materials, Inc., of Santa Clara, Calif., as shown and described in U.S. Pat. No. 5,738,574, entitled, "Continuous Processing System for Chemical Mechanical Polishing," the entirety of which is incorporated herein by reference to the extent not inconsistent with the invention. Although, the CMP process and composition are illustrated utilizing the Mirra® CMP System having rotational platens, any linear or rotational polishing system enabling polishing using the methods described herein, such as the Reflexion™ CMP System available from Applied Materials, Inc., of Santa Clara, Calif., can be used to advantage. The following apparatus description is illustrative and should not be construed or interpreted as limiting the scope of the invention.

Figure 1:
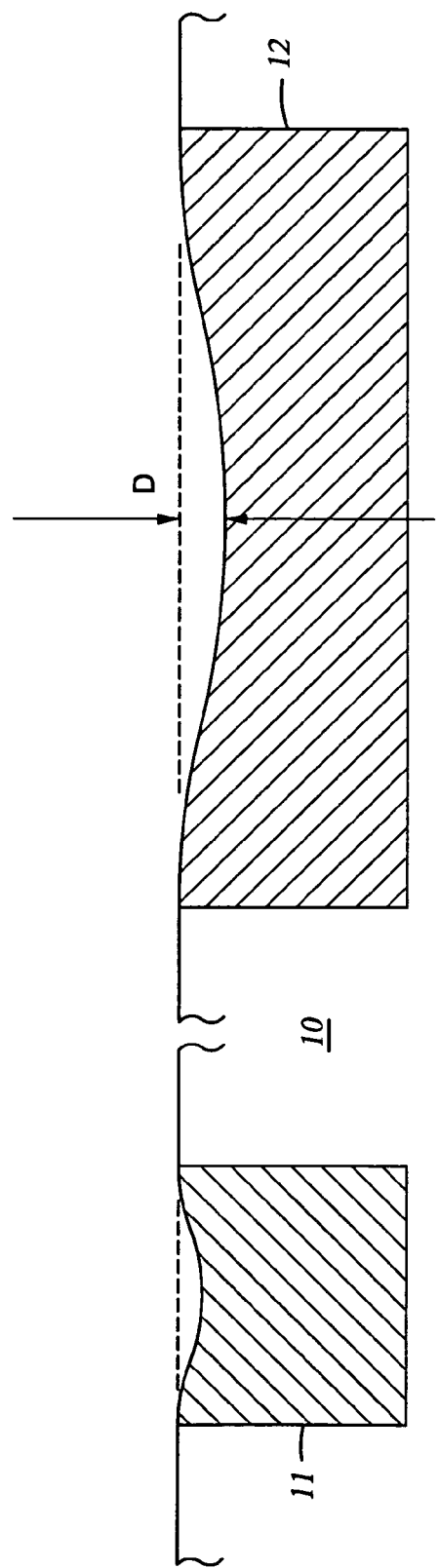
FIG. 1 is a schematic view of a substrate illustrating the phenomenon of dishing.
Figure 2:
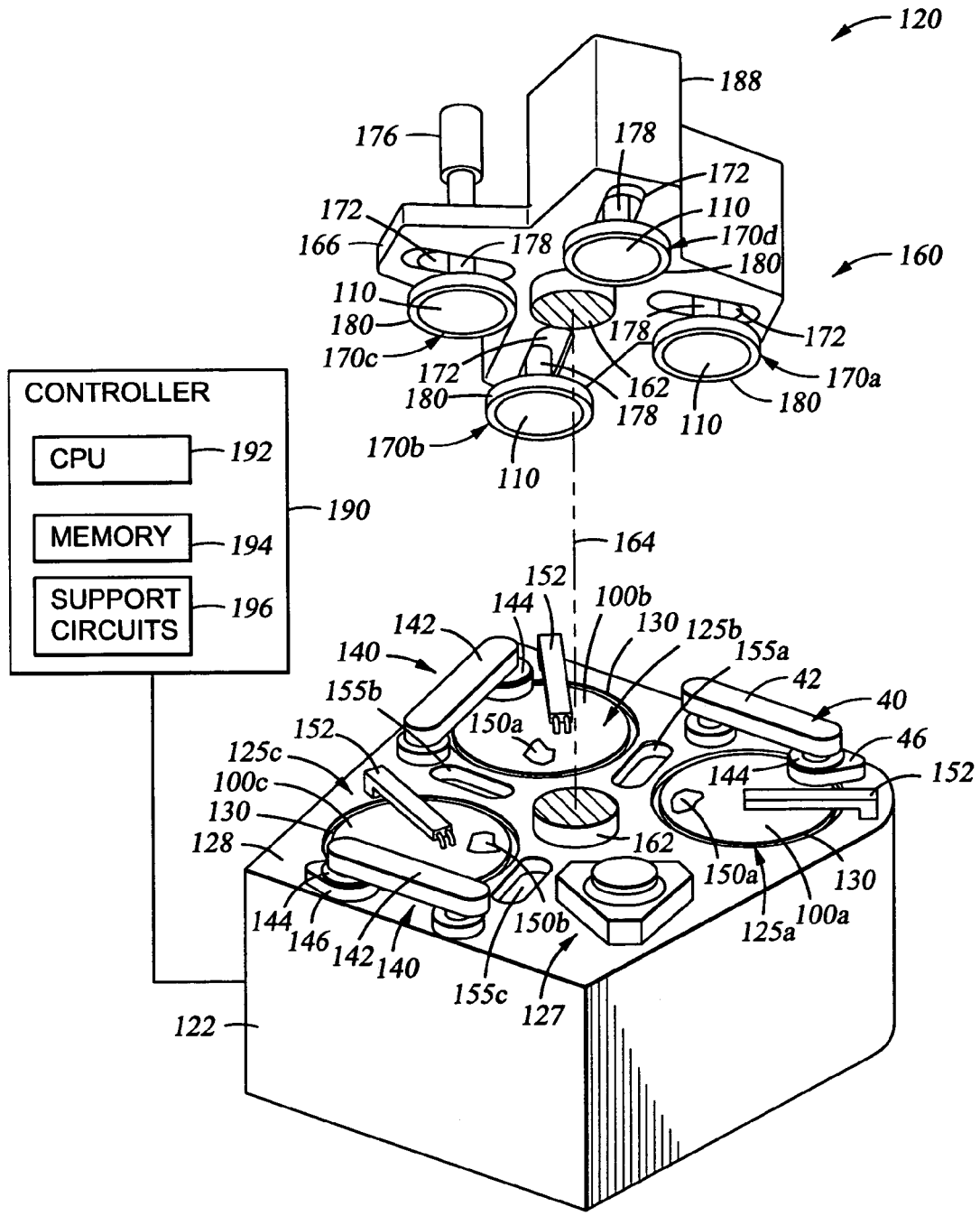
FIG. 2 is a schematic perspective view of a chemical mechanical polishing apparatus.

FIG. 2 is a schematic perspective view of a chemical mechanical polishing system or apparatus 120 for performing the planarizing processes and for use with the CMP compositions described herein. The polishing apparatus 120 includes a lower machine base 122 with a table top 128 mounted thereon and a removable outer cover (not shown).

The table top 128 supports a series of polishing stations, including a first polishing station 125a, a second polishing station 125b, a final polishing station 125c, and a transfer station 127. The transfer station 127 serves multiple functions, including, for example, receiving individual substrates 110 from a loading apparatus (not shown), washing the substrates, loading the substrates into carrier heads 180, receiving the substrates 110 from the carrier heads 180, washing the substrates 110 again, and transferring the substrates 110 back to the loading apparatus.

A computer based controller 190 is connected to the polishing system or apparatus 120 for instructing the system to perform one or more processing steps on the system, such as polishing a substrate or transferring a substrate in the polishing apparatus 120. In one embodiment, the invention may be implemented as a computer program-product for use with a computer system or computer based controller 190. The programs defining the functions of the preferred embodiment can be provided to a computer via a variety of signal-bearing media and/or computer readable media, which include but are not limited to, (i) information permanently stored on non-writable storage media (e.g., read-only memory devices within a computer such as read-only CD-ROM disks readable by a CD-ROM or DVD drive; (ii) alterable information stored on a writable storage media. (e.g., floppy disks within a diskette drive or hard-disk drive); or (iii) information conveyed to a computer by a communications medium, such as through a computer or telephone network, including wireless communication. Such signal-bearing media, when carrying computer-readable instructions that direct the functions of the invention, represent alternative embodiments of the present invention. It may also be noted that portions of the product program may be developed and implemented independently, but when combined together are aspects described herein.

Each polishing station 125a–125c includes a rotatable platen 130 having polishing media, such as polishing pads 100a, 100b, or 100c disposed thereon. The polishing pad is a polishing pad having a durable roughened surface typically composed of microporous polyurethane or polyurethane mixed with filler. Polishing pads 100a, 100b and 100c may be embossed or stamped with a pattern to improve distribution of slurry across the face of the substrate. Polishing pads 100a, 100b and 100c may include a hard polishing material, a soft polishing material, or combinations thereof.

A hard polishing material is broadly described herein as a polishing material having a polishing surface of a hardness of about 50 or greater on the Shore D Hardness scale for polymeric materials as described and measured by the American Society for Testing and Materials (ASTM), headquartered in Philadelphia, Pa. A suitable hard polishing material is a material comprising the IC-1000, IC-1010, and the IC-1400 polishing pads available from Rodel Inc. of Phoenix, Ariz. (IC-1000 is a product name of Rodel, Inc.)

The polishing pads 100a, 100b, and 100c may also include composite pads of one or more layers, with a surface layer having a hardness of about 50 or greater on the Shore D Hardness scale. The composite pads may have an overall hardness of less than about 50 on the Shore D Hardness scale. While the description herein describes the use of the IC series of pads from Rodel Inc., the invention is equally applicable to all polishing pads having the hardness described herein.

A hard polishing material is broadly described herein as a polishing material having a polishing surface of a hardness of less than about 50 on the Shore D Hardness scale for polymeric materials as described and measured by the American Society for Testing and Materials (ASTM), headquartered in Philadelphia, Pa. The soft polishing pad may be composed of a napped poromeric synthetic material, such as a uniformly compressible material including a polymeric material, i.e., plastic, and/or foam, felt, rubber, or a combination thereof. An example of a soft polishing material is polyurethane impregnated with felt. An available soft polishing pad is included in the Politex or Suba series, i.e., Suba IV, of polishing pads available from Rodel, Inc. (Politex and Suba are tradenames of Rodel, Inc.)

Alternatively, polishing pads 100a, 100b, 100c may be a standard two-layer pad in which the upper layer has a durable roughened surface and is harder than the lower layer. For example, the upper layer of the two-layer pad may be composed of microporous polyurethane or polyurethane mixed with filler, whereas the lower layer maybe composed of compressed felt fibers leached with urethane. Both the upper and lower layers may be approximately fifty mils thick. A two-layer standard pad, with the upper layer composed of IC-1000 and the lower layer composed of SUBA-4, is available from Rodel (IC-1000 and SUBA-4 are product names of Rodel, Inc.).

In one embodiment of the apparatus, the first polishing station 125a has a first hard polishing pad for the first polishing pad 100a disposed on a platen 130, and the platen 130 disposed thereon is adapted for polishing a substrate to remove bulk copper-containing material disposed on the substrate. The second polishing station 125b has a second hard polishing pad for the second polishing pad 100b disposed on a platen 130, and the platen 130 disposed thereon is adapted for polishing a substrate to remove residual copper-containing material disposed on the substrate. A third polishing station 125c having a soft polishing pad for the polishing pad 100c may be used for a barrier removal process, such as removing a tantalum containing material, e.g., tantalum and tantalum nitride, on the substrate and dielectric layer buffing following the two-step copper removal process.

A rotatable linear platen may be used for the second polishing station 125b. An example of a linear polishing system, and an example of a polishing system having a rotatable polishing pad and a rotatable linear platen, is more fully described in co-pending U.S. patent application Ser. No. 09/244,456, filed on Feb. 4, 1999, and incorporated herein by reference to the extent not inconsistent with the invention. Alternatively, a stationary platen or a rotatable or linear platen having a stationary media may be used for the first, second, or third polishing stations 125a, 125b, and 125c.

The invention also contemplates the use of an orbital polishing process or orbital polishing platen for the first, second, and/or third polishing stations 125a, 125b, and 125c. A substrate and polishing media can be moved in an orbital relative motion in a linear drive system where the media is stationary; an example of an apparatus capable of performing the orbital relative motion between the polishing media and substrate is the Model 8200, available from Applied Materials Inc., of Santa Clara, Calif.

Each platen 130 may be a rotatable aluminum or stainless steel platen connected to a platen drive motor (not shown). The polishing stations 125a–125c may include a pad conditioner apparatus 140. The pad conditioner apparatus 140 has a rotatable arm 142 holding an independently rotating conditioner head 144 and an associated washing basin 146. The pad conditioner apparatus 140 maintains the condition of the polishing pad so that it will effectively polish the substrates. Each polishing station may include a conditioning station if the CMP apparatus is used with other media configurations.

The polishing stations 125a–125c may each have a composition delivery/rinse arm 152 that includes two or more supply tubes to provide one or more CMP compositions, cleaning compositions, and/or water to the surface of the polishing media. The composition delivery/rinse arm 152 delivers the one or more chemical slurries in amounts sufficient to cover and wet the entire polishing media. Each composition delivery/rinse arm 152 also includes several spray nozzles (not shown) that can provide a high-pressure fluid rinse onto the polishing media at the end of each polishing and conditioning cycle. Furthermore, two or more intermediate washing stations 155a, 155b, and 155c may be positioned between adjacent polishing stations 125a, 125b, and 125c to clean the substrate as it passes from one station to the next.

A rotatable multi-head carousel 160 is positioned above the lower machine base 122. The carousel 160 includes four carrier head systems 170a, 170b, 170c, and 170d. Three of the carrier head systems receive or hold the substrates 110 by pressing them against the polishing pads 100 disposed on the polishing stations 125a–125c. One of the carrier head systems 170a–170d receives a substrate from and delivers a substrate 110 to the transfer station 127. The carousel 160 is supported by a center post 162 and is rotated about a carousel axis 164 by a motor assembly (not shown) located within the machine base 122. The center post 162 also supports a carousel support plate 166 and a cover 188.

The four carrier head systems 170a–170d are mounted on the carousel support plate 166 at equal angular intervals about the carousel axis 164. The center post 162 allows the carousel motor to rotate the carousel support plate 166 and orbit the carrier head systems 170a–170d about the carousel axis 164. Each carrier head system 170a–170d includes one carrier head 180. A carrier drive shaft 178 connects a carrier head rotation motor 176 (shown by the removal of one quarter of the cover 188) to the carrier head 180 so that the carrier head 180 can independently rotate about its own axis. There is one carrier drive shaft 178 and motor 176 for each head 180. In addition, each carrier head 180 independently oscillates laterally in a radial slot 172 formed in the carousel support plate 166.

The carrier head 180 performs several mechanical functions. Generally, the carrier head 180 holds the substrate 110 against the polishing pads 100, evenly distributes a downward pressure across the back surface of the substrate 110, transfers torque from the drive shaft 178 to the substrate 110, and ensures that the substrate 110 does not slip out from beneath the carrier head 180 during polishing operations.

To facilitate control of the system as described above, the controller 190 may include a CPU 192 of FIG. 2, which CPU 192 may be one of any form of computer processors that can be used in an industrial setting for controlling various chambers and subprocessors. The memory 194 is coupled to the CPU 192. The memory 194, or computer-readable medium, may be one or more of the readily available memory such as random access memory (RAM), read only memory (ROM), floppy disk, hard disk, or any other form of digital storage, local or remote. For storing information and instructions to be executed by the CPU 192.

The support circuits 196 are coupled to the CPU 192 for supporting the processor in a conventional manner. These circuits include cache, power supplies, clock circuits, input/output circuitry and subsystems, and can include input devices used with the controller 190, such as keyboards, trackballs, a mouse, and display devices, such as computer monitors, printers, and plotters. Such controllers 190 are commonly known as personal computers; however, the present invention is not limited to personal computers and can be implemented on workstations, minicomputers, mainframes, and supercomputers.

A process, for example, the polishing process described below, is generally stored in the memory 194, typically as a software routine. The software routine may also be stored and/or executed by a second CPU (not shown) that is remotely located from the hardware being controlled by the CPU 192.

Although the process of the present invention is discussed as being implemented as a software routine, some or all of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Chemical Mechanical Polishing Process

Chemical mechanical polishing of substrate surfaces with improved polishing uniformity, improved planarization, enhanced residual material removal and reduced or minimal defect formation can be achieved by the application of increased platen rotational speeds with reduced low polishing pressures. In one aspect, copper-containing materials may be polishing from a substrate surface by a method having low polishing pressures, such as less than about 2 psi, and high platen rotational speed, such as greater than about 200 centimeters per second (cps) (e.g., greater than about 150 rpms for a 20 inch rotating platen). Conventional polishing processes use between about 26 cps and about 130 cps (e.g., between about 20 rpms and about 100 rpms for a 20 inch rotating platen), and a polishing pressure between about 2 psi and about 6 psi.

Polishing at the low polishing pressure and high platen rotational speed has been observed to be effective in polishing conductive materials from substrate having low dielectric constant (k) materials (i.e., dielectric constants of about 4 or less.) at removal rates up to about 10000 Å/min with reduced or minimal damage, such as film delamination, to the underlying low k dielectric material and effective planarization of bulk copper materials with minimal dishing.

The low pressure/high platen rotational speed polishing process is performed by rotating a polishing pad on the platen to provide an average platen rotational speed of about 200 cps or greater (about 150 rpm or greater), such as between about 200 cps and about 1000 cps (about 150 rpm and about 750 rpm). The substrate platen may be rotated at a rotational speed between about 200 cps and about 350 cps (about 150 rpm and about 250 rpm). The substrate, which may be disposed in a carrier head system, may also be rotated at a rotational speed between about 195 cps and about 650 cps (between about 150 rpm and about 500 rpm), such as between about 400 cps (about 300 rpm) and about 650 cps (about 500 rpm). The substrate is contacted with the polishing pad using a polishing pressure of about 2 psi or less, such as between about 0.1 psi and about 1.5 psi.

A polishing composition is applied to the substrate and polishing pad during polishing. The substrate and the polishing pad are typically exposed to the polishing composition and contacted for a period of time between about 5 seconds and about 30 seconds, such as about 20 seconds. The polishing composition may be supplied to the polishing platen at a flow rate of about 100 ml/min or greater. An example of a suitable polishing composition includes EPC-5001, which is commercially available from Cabot Corp. of Aurora, Ill. The process and polishing composition may be used to remove copper material at a higher removal rate than the barrier layer material. For example, polishing the substrate surface with the EPC-5001 slurry by the process described herein was observed to have a removal rate ratio, or selectivity, of copper to barrier material of about 20:1. The composition and process parameters may be chosen to provide selectivities of copper to barrier of about 10:1 or greater to effectively remove copper material with reduced or minimal barrier layer removal.

The polishing composition may be an abrasive-containing polishing composition. The abrasive-containing polishing composition may have up to about 1 wt. %, for example, up to about 0.1 wt. %, of abrasives. In one aspect of the polishing composition, a polishing composition having between about 0.1 wt. % and about 0.5 wt. % may be used.

The low pressure/high platen rotational speed polishing process may remove copper-containing materials a rate of about 2500 Å/min or greater, such as between about 3000 Å/min and about 8000 Å/min, for example 4500 Å/min.

The low pressure/high platen rotational speed polishing process may be integrated into a multi-step polishing process. In one example, a two-step process may be used to planarize high overfilling substrates. Overfilling is defined herein as excess deposition of bulk material over features formed in the substrate surface compared to bulk material deposited over the field of the substrate. The first polishing step includes the low pressure/high platen rotational speed polishing process for reducing the overfilling thickness with less bulk material removal on the field of the substrate. A second step is then used to remove remaining bulk material with low dishing and erosion. The second step may include a second low pressure/high platen rotational speed polishing process.

In another example, a three-step polishing process using the low pressure/high platen rotational speed polishing process as an intermediate step may be used to planarize copper-containing materials on a substrate surface. The first polishing step is used to remove bulk conductive material, such as copper overfill, disposed on the substrate surface, the second polishing step achieves improved planarization of the substrate surface, and the third step is used to effect removal of bulk conductive materials and any residual conductive materials. A barrier layer polishing composition is used with polishing media to remove the barrier layer typically disposed above a dielectric layer following removal of the conductive material. The two and three-step processes will now be described in relation to polishing a substrate surface.

In another example, a two-step polishing process using the low pressure/high platen rotational speed polishing process as an initial polishing step to remove bulk material followed by a low pressure, low platen rotational speed polishing step may be performed to planarize copper-containing materials on a substrate surface.

Examples of substrate that may be polished according to the processes described herein may be formed by a process including etching feature definitions in a dielectric layer, depositing a barrier layer material on the substrate surface and in the feature definitions, and depositing a bulk copper-containing material over the substrate surface to fill the feature definitions.

As used throughout this disclosure, the phrase "copper-containing material", "copper" and the symbol Cu are intended to encompass high purity elemental copper as well as doped copper and copper-based alloys, e.g., doped copper and copper-based alloys containing at least about 80 wt. % copper. Bulk copper containing material is broadly defined herein as copper containing material deposited on the substrate in an amount more than sufficient to substantially fill features formed on the substrate surface. Residual copper containing materials is broadly defined as any bulk copper containing material remaining after one or more polishing process steps. Residual copper-containing material can include copper, copper alloys, copper oxides, and/or doped copper.

The barrier layer material includes tantalum, tantalum nitride, and derivatives thereof, such as tantalum silicon nitride. The invention described herein also contemplates the use of other barrier materials known or unknown that may used as a barrier with conductive materials, such as copper.

The dielectric layer can comprise any of various dielectric materials known or unknown that may be employed in the manufacture of semiconductor devices. For example, dielectric materials, such as silicon dioxide, phosphorus-doped silicon glass (PSG), boron-phosphorus-doped silicon glass (BPSG), and carbon-doped silicon dioxide, can be employed. The dielectric layer can also comprise low dielectric constant (k) materials, including fluoro-silicon glass (FSG), polymers, such as polymides, and carbon-containing silicon oxides, such as Black Diamond™, available from Applied Materials, Inc. of Santa Clara, Calif. The openings are formed in interlayer dielectrics by conventional photolithographic and etching techniques. The invention also contemplates the use of dielectric materials, known or unknown that may be used as dielectric layers in semiconductor fabrication.

While the invention is described in relation to processing steps, the steps described herein should not be construed or interpreted as limiting the practice or scope of the invention. For example, the two-step and three-step process steps may be performed as part of one continuous operation or two or more distinct operations. While the following process described herein illustrates polishing the substrate on two platens, the invention contemplates polishing the substrate by the process described herein on apparatus having one or more platens. For example, the invention contemplates that the steps may be performed on the same platen or that portions of some process steps may be performed on multiple platens.

Additionally, while the following processing parameters are generally described for polishing 200 mm substrates, the invention contemplates modifying processing parameters to satisfy the requirements for polishing substrates of different sizes, such as 300 mm substrates, and polishing on various apparatus, such as orbital motion polishing apparatus. The process described below should be considered illustrative, and should not be construed or interpreted as limiting the scope of the invention.

In one aspect, a two-step polishing process is provided for processing a substrate having low k dielectric materials disposed thereon by polishing a substrate at a polishing pressure of about 2 psi or less and an average platen rotational speed of about 200 cps or greater (about 150 rpm or greater) and then polishing the substrate at a polishing pressure of about 1.5 psi or less. The first polishing step is used to remove bulk material, such as bulk copper material, from a substrate surface, and the second polishing step is used to remove residual copper-containing material from a substrate surface with low dishing and erosion.

The first polishing step includes positioning the substrate on a first platen containing a polishing pad 100 disposed on platen 130 in polishing station 125a. The polishing pad 100a is rotated at a platen rotational speed of about 200 cps or greater (150 rpm or greater), such as between about 200 cps and about 1000 cps (about 150 rpm to about 750 rpms) on the rotatable platen 125a. A platen rotational speed of between about 200 cps and about 350 cps (about 150 rpm to about 250 rpms) may be used to polish the substrate surface. The substrate disposed in a carrier head system 170 is rotated at a rotational speed between about 195 cps and about 650 cps (between about 150 rpm and about 500 rpm), such as between about 400 cps (about 300 rpm) and about 650 cps (about 500 rpm). A pressure of about 1.5 psi or less, such as between about 0.1 psi and about 1.0 psi, is generally applied between the substrate and the polishing media during the polishing process. A polishing pressure between about 0.5 psi and about 0.8 psi may be used for the first polishing step.

The first polishing composition is supplied to the polishing pad 100a at a flow rate of about 100 ml/min or greater from a storage medium disposed near the CMP apparatus. Typically, a flow rate of between about 100 ml/min and about 300 ml/min may be supplied to the polishing pad for polishing the substrate. Examples of suitable polishing compositions, including abrasive-containing polishing compositions, commercially available for removing copper-containing material in the first polishing step include EPC-5003, EPC-5001, and EPC-5306, available from Cabot Corp. of Aurora, Ill., and HS-C430-A3, HS-C430-A1, HS-C430-A22, HS-C430-A33, available from Hitachi Chemical Corp. of Japan, of which EPC-5003 is preferred. The abrasive-containing polishing compositions may include up to about 1 wt. % of abrasives, such as between about 0.01 wt. % and about 0.1 wt. %.

The substrate and the polishing pad are typically exposed to the polishing composition and contacted for a period of time sufficient to remove at least a portion or all of the bulk copper-containing material disposed thereon. For example, the polishing pad may be exposed to the first polishing composition between about 30 seconds and about 180 seconds, but may vary depending upon the material being removed, the concentration of the components of the first polishing composition, and the amount or thickness of bulk copper-containing material on the substrate. The copper-containing material may be removed at a rate between about 4000 Å/min and about 8,000 Å/min or any rate to remove the bulk copper-containing materials deposited on the substrate.

The second processing step includes polishing the substrate with a second polishing composition that may be abrasive-containing or abrasive-free, at a polishing pressure of about 1.5 psi or less. An abrasive-containing polishing composition may be used to polish the substrate at a polishing pressure of about 1.5 psi or less and a platen rotational speed between about 15 cps and about 400 cps (about 10 rpm to about 300 rpm). An example of polishing parameters for the second polishing step includes polishing at 400 cps (300 rpm) and 0.5 psi for an abrasive-containing polishing composition. An example of an abrasive-containing polishing composition is Cabot 5003, commercially available from Cabot Corp. of Aurora, Ill.

An abrasive-free polishing composition may be used to polish the substrate at a polishing pressure of about 1.5 psi or less and a platen rotational speed between about 200 cps to about 1000 cps (about 150 rpm to about 750 rpm). An example of polishing parameters for the second polishing step includes polishing at 400 cps (300 rpm) and 0.5 psi for an abrasive-free polishing composition. An example of an abrasive-containing polishing composition is disclosed in U.S. patent application Ser. No. 09/544,281, filed on Apr. 6, 2000, entitled, "Abrasive-Free Metal CMP In Passivation Domain", which is incorporated herein by reference to the extent not inconsistent with the claimed aspects and disclosure herein.

The substrate and the polishing media are typically exposed to the second polishing composition for a period of time sufficient to remove the residual copper-containing materials disposed thereon and provide for overpolishing of the substrate surface to further remove defects formed thereon. For example, the polishing media may be exposed to the second polishing composition between about 30 seconds and about 180 seconds, but may vary depending upon the material being removed, the concentration of the components of the second polishing composition, and the amount or thickness of residual copper material on the substrate. The copper-containing material is removed at a rate up to about 2000 Å/min or less, such as between about 500 Å/min and about 2000 Å/min. Following copper-containing material removal, the substrate may be polished to remove the barrier layer and cleaned as described herein.

In another example, a two-step polishing process is provided for processing a substrate having low k dielectric materials disposed thereon by polishing a substrate at a polishing pressure of about 2 psi or less and an average platen rotational speed of about 200 cps or greater (about 150 rpm or greater) and then polishing the substrate at a polishing pressure of about 2 psi or less and an average platen rotational speed of about 100 cps or less (about 75 rpms or less). The first polishing step is used to remove bulk material, such as bulk copper material, from a substrate surface, and the second polishing step is used to remove residual copper-containing material from a substrate surface with low dishing and erosion. The pressure may remain constant during both polishing processes. Alternatively, the second pressure may be less than the first pressure as described herein for a two-step polishing process.

The first polishing step includes positioning the substrate on a first platen containing a polishing pad 100 disposed on platen 130 in polishing station 125a. The polishing pad 100a is rotated at a platen rotational speed of about 200 cps or greater (150 rpm or greater), such as between about 200 cps and about 1000 cps (about 150 rpm to about 750 rpms) on the rotatable platen 125a. A platen rotational speed of between about 200 cps and about 500 cps (about 150 rpm to about 375 rpms), such as between about 200 cps and about 350 cps (about 150 rpm to about 250 rpms) may be used to polish the substrate surface. The substrate disposed in a carrier head system 170 is rotated at a rotational speed between about 195 cps and about 650 cps (between about 150 rpm and about 500 rpm), such as between about 400 cps (about 300 rpm) and 650 cps (about 500 rpm).

A pressure of about 2.0 psi or less, such as about 1.5 psi or less, for example, between about 0.1 psi and about 1.0 psi, is generally applied between the substrate and the polishing media during the polishing process. A polishing pressure between about 0.5 psi and about 0.8 psi may be used for the first polishing step.

The first polishing composition is supplied to the polishing pad 100a at a flow rate of about 100 ml/min or greater from a storage medium disposed near the CMP apparatus. Typically, a flow rate of between about 100 ml/min and about 300 ml/min may be supplied to the polishing pad for polishing the substrate. Examples of suitable polishing compositions, including abrasive-containing polishing compositions, commercially available for removing copper-containing material in the first polishing step include EPC-5003, EPC-5001, and EPC-5306, available from Cabot Corp. of Aurora, Ill., and HS-C430-A3, HS-C430-A1, HS-C430-A22, HS-C430-A33, available from Hitachi Chemical Corp. of Japan, of which EPC-5003 is preferred. The abrasive-containing polishing compositions may include up to about 1 wt. % of abrasives, such as between about 0.1 wt. % and about 0.5 wt. %.

The substrate and the polishing pad are typically exposed to the polishing composition and contacted for a period of time sufficient to remove at least a portion or all of the bulk copper-containing material disposed thereon. For example, the polishing pad may be exposed to the first polishing composition between about 30 seconds and about 180 seconds, but may vary depending upon the material being removed, the concentration of the components of the first polishing composition, and the amount or thickness of bulk copper-containing material on the substrate. The copper-containing material may be removed at a rate between about 4000 Å/min and about 8,000 Å/min or any rate to remove the bulk copper-containing materials deposited on the substrate.

The second processing step includes polishing the substrate with a second polishing composition that may be abrasive-containing or abrasive-free, at a second polishing pressure of about 2.0 psi or less and a second platen rotational speed less than the first rotational speed.

The polishing pad 100a is rotated at a platen rotational speed of about 100 cps or less (75 rpm or greater), such as between about 50 cps and about 100 cps (about 37 rpm to about 75 rpms) on the rotatable platen 125a. The substrate disposed in a carrier head system 170 is rotated at a rotational speed between about 195 cps and about 650 cps (between about 150 rpm and about 500 rpm), such as between about 400 cps (about 300 rpm) and about 650 cps (about 500 rpm). The second polishing pressure may be maintained at the first polishing pressure or may be less than the first polishing pressure. An abrasive-containing polishing composition or an abrasive-free polishing composition may be used to polish the substrate during this two-step process.

The substrate and the polishing media are typically exposed to the second polishing composition for a period of time sufficient to remove the residual copper-containing materials disposed thereon and provide for overpolishing of the substrate surface to further remove defects formed thereon. For example, the polishing media may be exposed to the second polishing composition between about 30 seconds and about 180 seconds, but may vary depending upon the material being removed, the concentration of the components of the second polishing composition, and the amount or thickness of residual copper material on the substrate. The copper-containing material is removed at a rate up to about 2000 Å/min or less, such as between about 500 Å/min and about 2000 Å/min. Following copper-containing material removal, the substrate may be polished to remove the barrier layer and cleaned as described herein.

Figure 3:
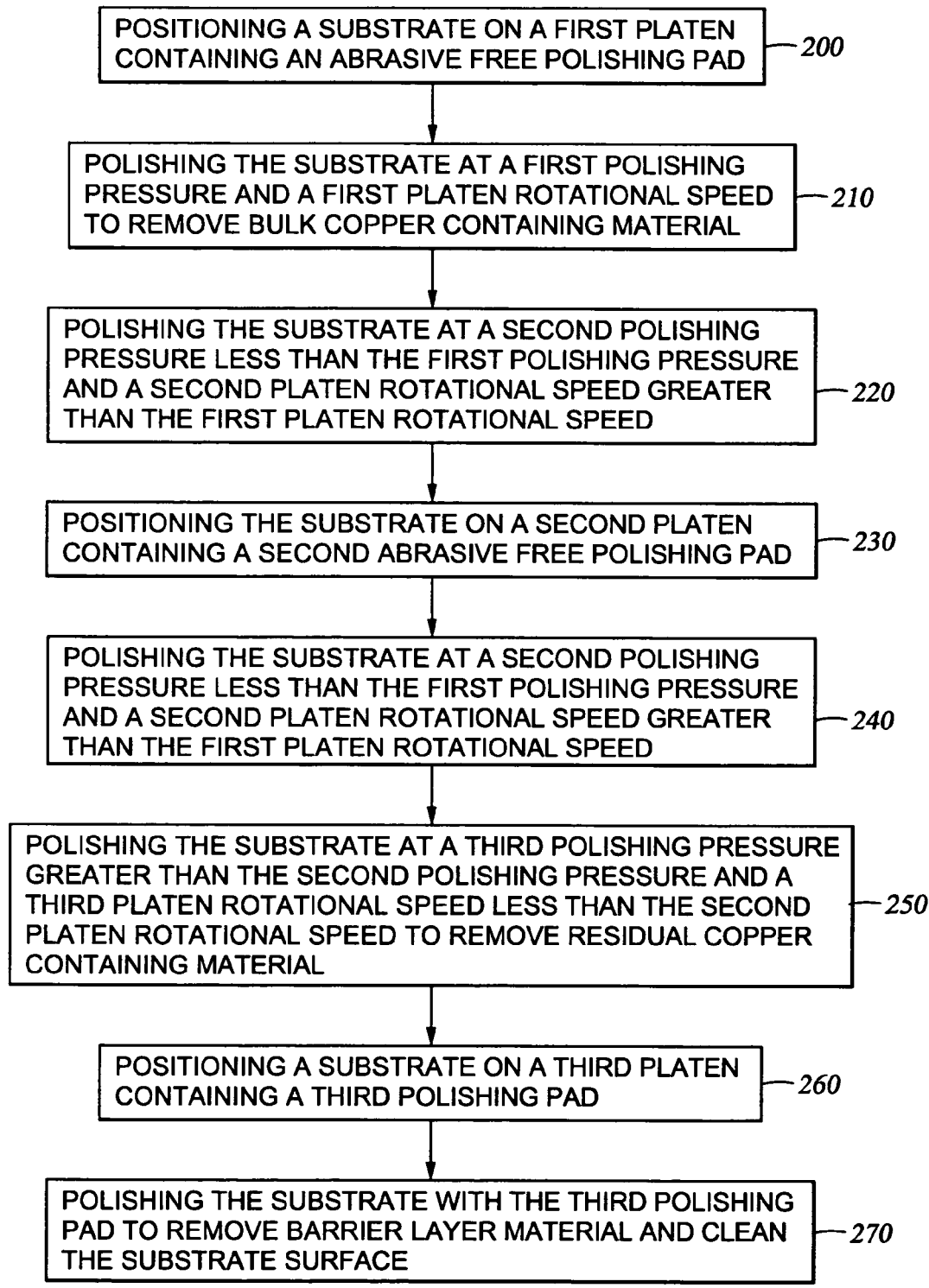
FIG. 3 is a flowchart illustrating one embodiment of the method described herein.

FIG. 3 is a flow chart illustrating one embodiment of a process for utilizing the apparatus described herein to remove materials in a three-step planarization process. A substrate is positioned on a first platen containing an abrasive-free polishing pad and a first polishing composition is supplied to the polishing pad 100 at step 200. Bulk copper containing materials are then removed from the surface of the substrate by polishing the substrate at a first polishing pressure and a first platen rotational speed at step 210. The substrate is then polished at a second polishing pressure less than the first polishing pressure and a second platen rotational speed greater than the first platen rotational speed to planarize the polished material at step 220. The substrate is then transferred to a second polishing platen at step 230. The substrate is polished at a second platen rotational speed greater than the first platen rotational speed at step 240. The substrate is then polished at a third polishing pressure greater than the second polishing pressure and a third platen rotational speed less than the second platen rotational speed at step 250. The substrate may then be positioned at a third platen in step 260 and polished to remove the barrier layer and to be cleaned at step 270.

In the first polishing step of the three-step polishing process, the substrate is positioned on a first platen containing a polishing pad 100 disposed on platen 130 in polishing station 125a. The carousel 160 positions the substrate in contact with the polishing pad 100a, and the substrate and the polishing pad move relative to one another with a first polishing composition distributed between to effect chemical and mechanical activity on the substrate, and then the substrate is typically removed from contact with the polishing pad 100a.

The polishing pad 100a is rotated to provide an average platen rotational speed less than about 130 cps (less than about 100 rpm for a 20 inch platen), such as between about 26 cps and about 130 cps (about 20 rpm and about 100 rpm), on the rotatable platen 125a. The substrate platen may be rotated at a rotational speed between about 65 cps (about 50 rpms) and about 130 cps (about 100 rpm). The substrate disposed in a carrier head system 170 is rotated at a rotational speed between about 26 cps (20 rpm) and about 130 cps (100 rpm). A pressure between about 2 psi and about 6 psi is generally applied between the substrate and the polishing media during the polishing process.

The first polishing composition is supplied to the polishing pad 100a at a flow rate of about 100 ml/min or greater from a storage medium disposed near the CMP apparatus. Typically, a flow rate of between about 100 ml/min and about 300 ml/min may be supplied to the polishing pad for polishing the substrate. Examples of suitable polishing compositions, including abrasive-containing polishing compositions, commercially available for removing copper-containing material in the first polishing step include EPC-5003, EPC-5001, and EPC-5306, available from Cabot Corp. of Aurora, Ill., and HS-C430-A3, HS-C430-A1, HS-C430-A22, HS-C430-A33, available from Hitachi Chemical Corp. of Japan, of which EPC-5001 is preferred.

The substrate and the polishing pad are typically exposed to the polishing composition and contacted for a period of time sufficient to remove at least a portion or all of the bulk copper-containing material disposed thereon. For example, the polishing pad may be exposed to the first polishing composition between about 30 seconds and about 180 seconds, but may vary depending upon the material being removed, the concentration of the components of the first polishing composition, and the amount or thickness of bulk copper-containing material on the substrate. The copper-containing material may be removed at a rate between about 4000 Å/min and about 8,000 Å/min or any rate to remove the bulk copper-containing materials deposited on the substrate.

In the second polishing step, the substrate is then polished using a polishing pressure less than the first polishing pressure and at a platen rotational speed greater than the first platen rotational speed. The polishing pad 100a is rotated to provide an average platen rotational speed of about 200 cps or greater (about 150 rpm or greater), such as between about 200 cps and about 1000 cps (about 150 rpm and about 750 rpm). The substrate platen may be rotated at a rotational speed between about 150 rpm and about 250 rpm. The substrate disposed in a carrier head system 170 may also be rotated at a rotational speed between about 195 cps and about 650 cps (between about 150 rpm and about 500 rpm), such as between about 400 cps (300 rpm) and about 650 cps about (500 rpm). The substrate is polished using a polishing pressure of about 2 psi or less, such as between about 0.5 psi and about 1.5 psi.

The first polishing composition and flow rates may be used to polish the substrate in the second polishing step. The substrate and the polishing pad are typically exposed to the polishing composition and contacted for a period of time between about 5 seconds and about 30 seconds, such as about 20 seconds. The copper-containing material may be removed at a rate between about 150 Å/min or less, such as between about 50 Å/min and about 100 Å/min.

The substrate may then be positioned on a second platen containing a second polishing pad 100*b*, and includes positioning the substrate on the polishing pad 100*b* at polishing station 125*b*. A second polishing composition is supplied to the polishing pad 100*b*. The carousel 160 positions the substrate in contact with the polishing pad 100*b*, and the substrate and the polishing pad 100*b* move relative to one another with the composition distributed between to effect chemical and mechanical activity on the substrate, and then the substrate is typically removed from contact with the polishing pad 100*b*. Any remaining bulk copper-containing materials and residual copper-containing materials are then removed from the surface of the substrate on the second platen.

The second polishing step is again performed on the second platen as described for the first polishing platen. The polishing pad 100*a* is rotated to provide an average platen rotational speed of about 200 cps or greater (about 150 rpm or greater), such as between about 200 cps and about 1000 cps (about 150 rpm and about 750 rpm) and a polishing pressure of about 2 psi or less, such as between about 0.5 psi and about 1.5 psi. The substrate disposed in a carrier head system 170 may also be rotated at a rotational speed between about 195 cps and about 650 cps (between about 150 rpm and about 500 rpm), such as between about 400 cps (about 300 rpm) and about 650 cps (about 500 rpm). The second polishing composition may be supplied to the polishing platen at a flow rate of about 100 ml/min or greater. The second polishing composition may comprise the first polishing composition, for example, EPC-5001, available from Cabot Corp. of Aurora, Ill.

The substrate and the polishing pad are typically exposed to the polishing composition and contacted for a period of time between about 5 seconds and about 30 seconds, such as about 20 seconds. The copper-containing material may be removed at a rate between about 150 Å/min or less, such as between about 50 Å/min and about 100 Å/min.

The substrate may then polished using the third polishing step having a polishing pressure greater than the second polishing pressure and at a platen rotational speed less than the second platen rotational speed using a second polishing composition. The third polishing step provides an average platen rotational speed of less than about 130 cps (less than about 100 rpm), such as between about 26 cps and about 130 cps (about 20 rpm to about 100 rpm) and a polishing pressure of about 2 psi or greater, such as between about 2 and about 6 psi. The substrate disposed in a carrier head system 170 is rotated at a rotational speed between about 65 cps (about 50 rpms) and about 155 cps (about 120 rpms).

The second polishing composition may be supplied to the polishing platen at a flow rate of about 100 ml/min or greater.

The processing parameters of the third polishing step may be modified based upon the use of either an abrasive-containing or abrasive-free second polishing composition. For example, an abrasive-free polishing composition may be used to polish the substrate at a polishing pressure of about 3 psi and a platen rotational speed of about 80 cps (about 60 rpm). An abrasive-containing polishing composition may be used to polish a substrate at a polishing pressure of about 2 psi and about 130 cps (about 100 rpm).

The substrate and the polishing media are typically exposed to the second polishing composition in the third polishing step for a period of time sufficient to remove residual copper-containing materials disposed thereon and provide for overpolishing of the substrate surface to further remove defects formed thereon. For example, the polishing media may be exposed to the second polishing composition between about 30 seconds and about 180 seconds, but may vary depending upon the material being removed, the concentration of the components of the second polishing composition, and the amount or thickness of residual copper material on the substrate. The copper-containing material is removed at a rate up to about 2000 Å/min or less.

It has been observed that the two-step and three-step polishing processes described above reduce dishing of the copper-containing material, reduce the presence of residual materials, and improve polishing uniformity and planarization of the substrate surface during chemical mechanical polishing of the substrate surface.

Following conductive material removal, the barrier layer may be selectively removed in relation to the copper and dielectric materials, i.e., remove the barrier layer at higher removal rates than the copper or dielectric materials, or the barrier layer composition may non-selectively remove the copper, barrier, and dielectric materials at approximately equal rates.

The substrate may then be rinsed on following barrier layer removal to remove surface defects and particles adhering to the substrate surface. The above processing steps may be performed on the same apparatus or may be performed on more than one apparatus. Additionally, the substrate may be transferred to a cleaning module or subjected to an in situ cleaning process to also remove surface defects, such as oxides that form on the copper-containing material.

Barrier layer removal may be performed on the third platen by positioning the substrate on a third platen containing a polishing pad 100*c*, and typically includes positioning a substrate on the third polishing pad 100*c* disposed on platen 130 in polishing station 125*c*, supplying a barrier removal polishing composition to the polishing pad 100 and contacting the polishing media and substrate to remove barrier layer materials, such as tantalum containing materials, from the surface of the substrate by a polishing process on the substrate.

The polishing pad 100*c* is rotated at a rate between about 65 cps (about 50 rpms) and about 155 cps (about 120 rpms) for a polishing pad disposed on a rotatable platen. The substrate disposed in a carrier head system 170 is rotated at a rate between about 65 cps (about 50 rpms) and about 155 cps (about 120 rpms). The polishing pad and substrate are rotated in the same direction to provide a relative motion between one another. A pressure between about 0.5 psi and about 6 psi between the substrate and the polishing pad 100*c* is used to provide mechanical activity to the polishing process.

The barrier layer polishing composition is delivered or supplied to the polishing pad at a flow rate of about 100 ml/min or greater from a storage medium disposed near the CMP apparatus. Examples of suitable polishing compositions, including abrasive-containing polishing compositions and abrasive-free polishing compositions, commercially available for removing barrier layer material include HS-T605 and HS-T505, available from Hitachi Chemical Corp. of Japan. An example of a suitable polishing composition in disclosed in U.S. Provisional Patent Application No. 60/305,314, filed on Jul. 13, 2001, entitled, "Dual Reduced Agents For Optimum Barrier Removal In Chemical Mechanical Polishing", which is incorporated herein by reference to the extent not inconsistent with the claimed aspects and disclosure herein. The substrate and the polishing pad are typically exposed to the polishing composition and contacted for a period of time sufficient to remove the barrier layer material, for example between about 60 seconds and about 180 seconds. The barrier layer materials may be removed at a rate up to about 1200 Å/min.

Optionally, a cleaning solution may be applied to each of the polishing pads during or subsequent each of the polishing process to remove particulate matter and spent reagents from the polishing process as well as help minimize metal residue deposition on the polishing pads and defects formed on a substrate surface. An example of a suitable cleaning solution is Electra Clean™ commercially available from Applied Materials, Inc. of Santa Clara, Calif.

EXAMPLE

An example of a two-step copper polishing process according to aspects of the invention described herein is as follows. A substrate including a low k dielectric material, such as Black Diamond™ from Applied Materials, Inc. of Santa Clara, Calif., with feature definitions formed therein, a tantalum barrier layer deposited on the dielectric layer and in the feature definitions formed therein, and a copper-containing layer deposited on the barrier layer and filling the feature definitions formed therein is provided to the polishing apparatus disclosed above.

The substrate is positioned over an IC-1000 polishing pad of a first platen, and a first polishing composition of Cabot EPC-5001 is delivered to the polishing pad at a flow rate of about 200 ml/min. The platen is rotated at a platen rotational speed of about 800 cps (about 600 rpm) and a pressure of about 0.5 psi is applied between a substrate and polishing pad. The substrate is polished at this platen rotational speed and pressure for about 60 seconds at a rate of about 5000 Å/minute to remove the bulk copper material.

The substrate is then positioned over an IC-1000 polishing pad on a second platen, and a second polishing composition of Cabot EPC-5001 is delivered to the polishing pad at a flow rate of about 200 ml/min. The platen is then rotated at a platen rotational speed of about 400 cps (about 300 rpm) and at a polishing pressure of about 0.5 psi. The substrate is polished at this platen rotational speed and pressure for about 60 seconds at a rate of about 1500 Å/minute to remove the residual copper material. Alternatively, an abrasive-free polishing composition may be used at a platen rotational speed of about 400 cps (about 300 rpm) and at a polishing pressure of about 0.5 psi to remove residual copper material.

The substrate is then transferred to a third platen having a Politex polishing pad disposed thereon, and a barrier layer polishing composition is delivered to the polishing pad to remove the barrier layer material and planarize the surface of the substrate. The barrier layer polishing composition is provided at a flow rate of about 200 ml/min, the platen is rotated at a speed of about 120 cps (about 93 rpm), the carrier head is rotated at a speed of about 110 cps (about 87 rpms), and a pressure of about 2 psi is applied between a substrate and polishing pad. The substrate is then polished for a requisite amount of time at a rate up to about 1200 Å/minute to sufficiently remove the barrier layer materials. An Electra Clean™ solution is then used to clean the substrate surface following the polishing processes.

An example of a three-step polishing process according to aspects of the invention described herein is as follows. A substrate including a dielectric material with feature definitions formed therein, a tantalum barrier layer deposited on the dielectric layer and in the feature definitions formed therein, and a copper-containing layer deposited on the barrier layer and filling the feature definitions formed therein is provided to the polishing apparatus disclosed above.

The substrate is positioned over an IC-1000 polishing pad of a first platen, and a first polishing composition of Cabot EPC-5001 is delivered to the polishing pad at a flow rate of about 200 ml/min. The platen is rotated at a platen rotational speed of about 130 cps (100 rpm) and a pressure of about 5.5 psi is applied between a substrate and polishing pad and copper material is removed. The platen is then rotated at a rotational speed of about 200 cps (150 rpm) and at a polishing pressure of about 1 psi while continuing delivery of the first polishing composition to planarize the surface.

The substrate is then positioned over an IC-1000 polishing pad on a second platen, and a second polishing composition of Cabot EPC-5001 is delivered to the polishing pad at a flow rate of about 200 ml/min. The platen is then rotated at a platen rotational speed of about 200 cps (about 150 rpm) and at a polishing pressure of about 1 psi to remove copper material. The platen is then rotated at a platen rotational speed of about 130 cps (about 100 rpm) and a pressure of about 2 psi is applied between a substrate and polishing pad while continuing delivery of the second polishing composition. The substrate is then polished for a requisite amount of time at a rate of less than about 2000 Å/minute and about 8,000 Å/minute to sufficiently remove the residual copper material.

The substrate is then transferred to a third platen having a Politex polishing pad disposed thereon, and a barrier layer polishing composition is delivered to the polishing pad to remove the barrier layer material and planarize the surface of the substrate. The barrier layer polishing composition is provided at a flow rate of about 200 ml/min, the platen is rotated at a speed of about 120 cps (93 rpm), the carrier head is rotated at a speed of about 110 cps (about 87 rpms), and a pressure of about 2 psi is applied between a substrate and polishing pad. The substrate is then polished for a requisite amount of time at a rate up to about 1200 Å/minute to sufficiently remove the barrier layer materials. An Electra Clean™ solution is then used to clean the substrate surface following the polishing processes.

In an alternative method of the three-step polishing process, the substrate is positioned over an IC-1000 polishing pad of a first platen, the platen is rotated at a rotational speed of about 130 cps (about 100 rpm) and a pressure of about 5.5 psi is applied between a substrate and polishing pad, and a first polishing composition, such as abrasive containing Cabot EPC-5001, is delivered to the polishing pad at a flow rate of about 200 ml/min. The platen is then rotated at a rotational speed of about 260 cps (about 200 rpm) and at a polishing pressure of about 1 psi while continuing delivery of a second polishing composition of Cabot EPC-5003 at 200 ml/min.

The substrate is then positioned over an IC-1000 polishing pad on a second platen, and an abrasive free polishing composition is delivered to the polishing pad at a flow rate of about 200 ml/min. The abrasive free polishing composition may be used to polish the substrate at 260 cps (200 rpm) and 1 psi. Alternatively, an abrasive polishing composition, such as Cabot EPC-5003, may be used to polish the substrate at a platen rotational speed of 130 cps (100 rpm) and 1.5 psi. The platen is then rotated at a platen rotational speed of about 130 cps (about 100 rpm) and a pressure of about 2 psi is applied between a substrate and polishing pad while continuing delivery of a third polishing composition, such as EPC-5001. The substrate is then polished for a requisite amount of time at a rate of less than about 2000 Å/minute and about 8,000 Å/minute to sufficiently remove the residual copper material.

While the foregoing is directed to embodiments of the present invention, other and further embodiments of the invention may be devised without departing from the basic scope thereof, and the scope thereof is determined by the claims that follow.

What is claimed is:

1. A method for processing a substrate having a conductive material disposed thereon in a polishing apparatus, comprising:
    polishing the conductive material at a first polishing pressure of about 1.5 psi or less, a first carrier head rotational speed of about 195 cps or greater, and a first platen rotational speed of about 200 cps or greater on a first platen; and
    polishing the conductive material at a second polishing pressure of about 1.5 psi or less, a second carrier head rotational speed less than the first carrier head rotational speed, and a second platen rotational speed less than the first rotational speed on a second platen.

2. The method of claim 1, wherein the first polishing pressure is between about 0.2 psi and about 1.0 psi and the second polishing pressure is between about 0.2 psi and about 1.0 psi.

3. The method of claim 1, wherein the first platen rotational speed is between about 200 cps and about 500 cps and the second platen rotational speed is between about 50 cps and about 100 cps and the first carrier head rotational speed of between about 195 cps and about 650 cps and the second carrier head rotational speed of between about 65 cps and about 155 cps.

4. The method of claim 1, further comprising polishing the barrier material at a third platen.

5. The method of claim 1, wherein the conductive material comprises copper, doped copper, copper alloys, or combinations thereof and the barrier material comprises tantalum, tantalum nitride, or combinations thereof.

6. The method of claim 1, wherein polishing the substrate at the second polishing step comprises polishing with an abrasive polishing composition having up to about 1 wt. % of abrasives.

7. A method for processing a substrate comprising feature definitions formed in a dielectric layer, a barrier material deposited on the dielectric layer and in the feature definitions, and a conductive material deposited on the barrier material and filling the feature definitions to a polishing apparatus having one or more platens and one or more carrier heads, comprising:
    polishing the substrate at a polishing pressure of greater than 2 psi and a platen rotational speed between about 26 cps and about 130 cps on a first platen;
    polishing the substrate at a polishing pressure of 1.5 psi or less and a platen rotational speed of about 200 cps or greater on the first platen;
    polishing the substrate at a polishing pressure of 1.5 psi or less and a platen rotational speed of about 200 cps or greater on a second platen; and
    polishing the substrate at a polishing pressure of greater than 2 psi and a platen rotational speed between about 26 cps and about 130 cps on the second platen.

8. The method of claim 7, further comprising polishing the substrate to remove the barrier layer.

9. The method of claim 7, wherein the substrate is polished at a polishing pressure of about 5.5 psi and a platen rotational speed of about 130 cps (about 100 rpm) and then polished at a polishing pressure of about 1 psi and a platen rotational speed of about 200 cps on the first platen.

10. The method of claim 7, wherein the substrate is polished at a polishing pressure of about 1 psi and a platen rotational speed of about 200 cps and then is polished at a polishing pressure of about 5.5 psi and a platen rotational speed of about 130 cps on the second platen.

11. The method of claim 7, wherein the substrate is polished at a polishing pressure of about 1 psi and a platen rotational speed of about 200 cps and then is polished at a polishing pressure of about 3 psi and a platen rotational speed of about 60 rpm with an abrasive free polishing composition on the second platen.

12. The method of claim 7, wherein the substrate is polished at a polishing pressure of about 1 psi and a platen rotational speed of about 200 cps and then is polished at a polishing pressure of about 2 psi and a platen rotational speed of about 130 cps with an abrasive polishing composition on the second platen.

13. The method of claim 12, wherein the abrasive polishing composition includes up to about 1.0 wt. % abrasives.

14. The method of claim 7, wherein the conductive material comprises copper, doped copper, copper alloys, or combinations thereof, and the barrier layer comprises tantalum, tantalum nitride, or combinations thereof.

15. A method for processing a substrate having a conductive material disposed thereon in a polishing apparatus, comprising:
    polishing the substrate at a first platen rotational speed between about 200 cps and about 500 cps at a first polishing pressure between about 0.2 psi and about 1.0 psi; and
    polishing the substrate at a second platen rotational speed less than the first platen rotational speed and at a second polishing pressure between about 0.2 psi and about 1.0 psi, wherein the second platen rotational speed is about 100 cps or less, wherein polishing the substrate at the first platen rotational speed and the second platen rotational speed are performed on the same platen.

16. The method of claim 15, wherein the second platen rotational speed is between about 50 cps and about 100 cps.

17. The method of claim 15, wherein the polishing the substrate at the first platen further comprises a first carrier head rotational speed of between about 195 cps and about 650 cps and the polishing the substrate at the second platen further comprises a second carrier head rotational speed of between about 65 cps and about 155 cps.

18. The method of claim 15, wherein the conductive material comprises copper, doped copper, copper alloys, or combinations thereof.

19. The method of claim 15, wherein polishing the substrate at the second polishing comprises polishing with an abrasive polishing composition having up to about 1 wt. % of abrasives.

20. The method of claim 15, wherein the substrate further comprises a low k dielectric material, a barrier material disposed on the low k dielectric material, and the conductive material is disposed on the barrier material.

21. The method of claim 20, further comprising polishing the barrier material.

22. The method of claim 20, the barrier material comprises tantalum, tantalum nitride, or combinations thereof.

* * * * *